United States Patent
Salimath et al.

(10) Patent No.: US 12,218,668 B1
(45) Date of Patent: Feb. 4, 2025

(54) SYSTEM AND METHOD FOR SKYRMION BASED LOGIC DEVICE

(71) Applicant: Ceremorphic, Inc., San Jose, CA (US)

(72) Inventors: Akshaykumar Salimath, Hyderabad (IN); Sanghamitra Debroy, Hyderabad (IN); Venkat Mattela, San Jose, CA (US)

(73) Assignee: Ceremorphic, Inc., San Jose, CA (US)

( * ) Notice: Subject to any disclaimer, the term of this patent is extended or adjusted under 35 U.S.C. 154(b) by 170 days.

(21) Appl. No.: 18/115,727

(22) Filed: Feb. 28, 2023

(51) Int. Cl.
*H03K 19/18* (2006.01)
*H03K 19/00* (2006.01)
*H03K 19/21* (2006.01)

(52) U.S. Cl.
CPC ........ *H03K 19/18* (2013.01); *H03K 19/0008* (2013.01); *H03K 19/21* (2013.01)

(58) Field of Classification Search
CPC ..... H03K 19/18; H03K 19/0008; H03K 19/21
USPC ........................................................ 365/158
See application file for complete search history.

(56) References Cited

U.S. PATENT DOCUMENTS

| 9,653,136 | B2 * | 5/2017 | Cros | G11C 11/18 |
| 2022/0384717 | A1 * | 12/2022 | Kim | H10N 52/00 |

* cited by examiner

*Primary Examiner* — Alexander Sofocleous
*Assistant Examiner* — Tracy Hampton
(74) *Attorney, Agent, or Firm* — Minisandram Law Firm; Raghunath S. Minisandram

(57) ABSTRACT

A system and method for a logic device is disclosed. A substrate is provided. Three nanotracks are disposed over the substrate and intersect in a central portion. Two nanotracks are disposed about a first axis and one nanotrack is disposed about a second axis perpendicular to the first axis. A ground pad is disposed in the central portion. An input value is set by nucleating a skyrmion about a first end of the nanotracks disposed about the first axis. Presence of the skyrmion indicates a first value and absence indicates a second value. A charge current is passed in the substrate, along the first axis to move the nucleated skyrmions towards the central portion. Presence of the skyrmion is sensed in the central portion and indicates a first value when skyrmion is present.

18 Claims, 6 Drawing Sheets

X-Section P - P'

SYSTEM AND METHOD FOR SKYRMION BASED LOGIC DEVICE

RELATED APPLICATION

None

TECHNICAL FIELD

The present invention relates generally to logic devices and more specifically, to skyrmion based logic devices.

DESCRIPTION OF RELATED ART

The rapid development of information technology has ensured a continuous increase of the logic density over the past years. As the VLSI technology and associated CMOS based logic devices reach their limits, further increase in logic device density capacity can only be accomplished through novel approaches.

Further, continued requirement for minimal power consumption in computing devices configured to use these devices and utilization of semiconductor technology to construct these devices are desirable for mass adaptation of these devices. With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method is disclosed. A substrate is provided. The substrate includes a first pad disposed about a first axis, a central portion of the first pad divides the first pad into a first portion and a second portion. The first portion of the first pad extends from a first end of the substrate to the central portion of the first pad. The second portion of the first pad extends from a second end of the substrate to the central portion of the first pad. A ground pad is disposed about the central portion of the first pad. A first nanotrack is disposed about the first portion of the first pad, a second nanotrack is disposed about the second portion of the first pad. The third nanotrack is disposed about the central portion and extends about both sides of the central portion along a second axis, the second axis substantially perpendicular to the first axis. A first end of the first nanotrack is disposed about the first end of the substrate. A first end of the second nanotrack is disposed about the second end of the substrate. An input value is selectively defined by selectively nucleating a skyrmion about the first end of the first nanotrack, wherein presence of the skyrmion is indicative of a first value and absence of the skyrmion indicative of a second value. Another input value is selectively defined by selectively nucleating a skyrmion about the first end of the second nanotrack, wherein presence of the skyrmion is indicative of a first value and absence of the skyrmion indicative of a second value. A charge current is selectively passed through the substrate to selectively move the nucleated skyrmions towards the central portion of the first pad. Charge current is passed along the first axis. The presence of the skyrmion is sensed about the output portion of the second nanotrack. An output value is concluded as the first value when the presence of the skyrmion is sensed.

In another embodiment, a system is disclosed. A substrate is provided. The substrate includes a first pad disposed about a first axis, a central portion of the first pad divides the first pad into a first portion and a second portion. The first portion of the first pad extends from a first end of the substrate to the central portion of the first pad. The second portion of the first pad extends from a second end of the substrate to the central portion of the first pad. A ground pad is disposed about the central portion of the first pad. A first nanotrack is disposed about the first portion of the first pad, a second nanotrack is disposed about the second portion of the first pad. The third nanotrack is disposed about the central portion and extends about both sides of the central portion along a second axis, the second axis substantially perpendicular to the first axis. A first end of the first nanotrack is disposed about the first end of the substrate. A first end of the second nanotrack is disposed about the second end of the substrate. An input value is selectively defined by selectively nucleating a skyrmion about the first end of the first nanotrack, wherein presence of the skyrmion is indicative of a first value and absence of the skyrmion indicative of a second value. Another input value is selectively defined by selectively nucleating a skyrmion about the first end of the second nanotrack, wherein presence of the skyrmion is indicative of a first value and absence of the skyrmion indicative of a second value. A charge current is selectively passed through the substrate to selectively move the nucleated skyrmions towards the central portion of the first pad. Charge current is passed along the first axis. The presence of the skyrmion is sensed about the output portion of the second nanotrack. An output value is concluded as the first value when the presence of the skyrmion is sensed.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following figures.

DETAILED DESCRIPTION

To facilitate an understanding of the adaptive aspects of the present disclosure, an example logic device will be described. The specific construction and operation of the adaptive aspects of various elements of the example logic device is described.

Figure 1:
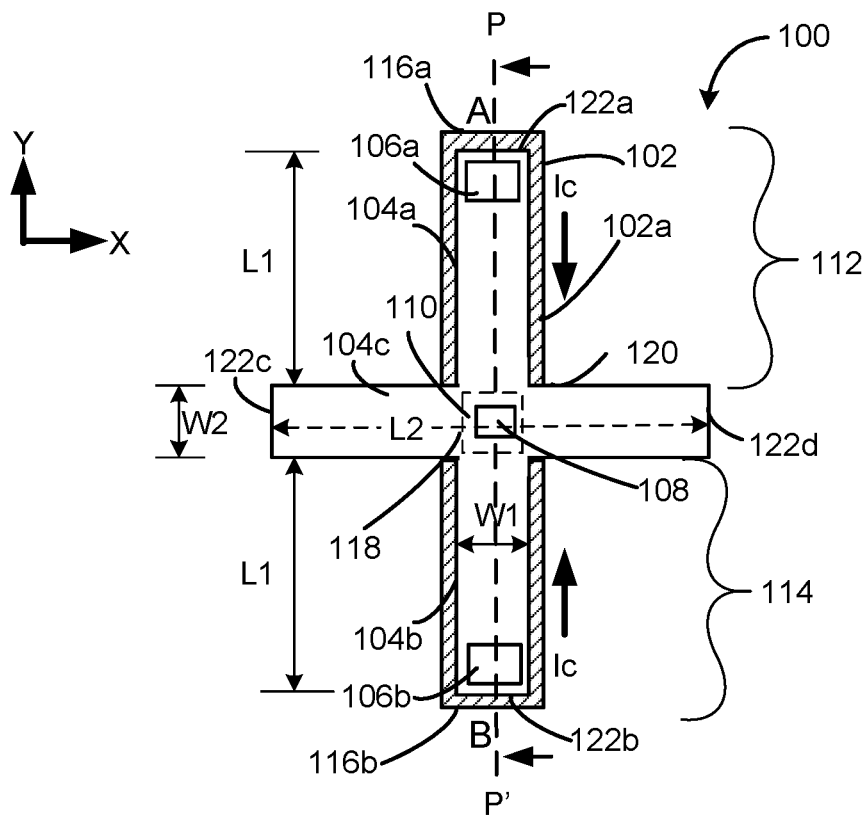
FIGS. 1, and 1A show an example logic device, according to one aspect of the present disclosure.
Figure 1A:
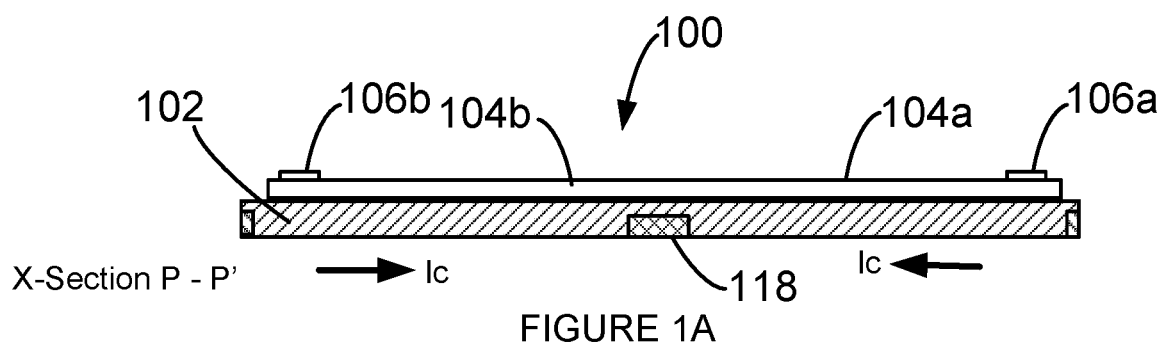

FIG. 1 shows an example logic device 100. The logic device 100 includes a substrate 102, a plurality of nanotracks 104a, 104b, and 104c, a plurality of nucleating devices 106a, and 106b, and a sense device 108. The substrate 102 is a conductive metal layer. The substrate 102 is substantially made of heavy metal, such as Tantalum (Ta), Platinum (Pt), or Tungsten (W) or an alloy of heavy metal. In one example, the substrate 102 is a layer of thin film with a very large spin hall angle, such as a layer of thin film of Tantalum (Ta), Platinum (Pt), or Tungsten (W) or an alloy of Tantalum (Ta), Platinum (Pt), or Tungsten (W). The substrate 102 is configured to receive a charge current and convert the charge current into a spin current, through spin Hall effect. The thickness of the substrate 102 may be of the order of about 2 nm to about 5 nm. As one skilled in the art appreciates, the substrate 102 may be deposited on a base layer (not shown). In some examples, base layer may be a silicon wafer.

The substrate 102 includes a first pad 102a, disposed about a first axis, in this example, Y axis. The substrate 102 further includes a second pad 102b, which is also disposed about the first axis. A central portion 110 of the first pad 102a divides the first pad 102a into a first portion 112 and a second portion 114. The first portion 112 extends from a first end 116a of the substrate 102 to the central portion 110. The second pad 102b extends from a second end 116b of the substrate 102 to the central portion 110. A ground pad 118 is disposed about the central portion 110. In some examples, central portion 110 may sometimes be referred to as output portion.

The plurality of nanotracks 104a, 104b, and 104c are disposed over the substrate 102. The plurality of nanotracks 104a, 104b, and 104c are composed of ferromagnetic material. In some examples, a suitable cobalt-nickel alloy or other similar materials (for example, nickel iron alloy, or cobalt, iron, nickel alloys) that provide high magnetic permeability may be used. In one example, the plurality of nanotracks 104a, 104b, and 104c are substantially rectangular in shape. The nanotrack 104a (sometimes referred to as first nanotrack 104a is disposed over the first portion 112 of the substrate 102 along the axis Y. The nanotrack 104b (sometimes referred to as second nanotrack 104b) is disposed over the second portion 114 of the substrate 102 along the axis Y. The nanotrack 104c (sometimes referred to as third nanotrack 104c is disposed over the central portion 110 of the substrate 102 along the axis X. The third nanotrack 104c extends on both sides of the central portion 110 of the substrate 102.

Each nanotrack has a first end. For example, first nanotrack 104a has a first end 122a. The second nanotrack 104b has a first end 122b. The third nanotrack 104c has a first end 122c and a second end 122d. In one example, a width W1 of the plurality of nanotracks 104a, and 104b is about 70 nanometers. A length L1 of the first nanotrack 104a and the second nanotrack 104b is about 240 nanometers. A length L2 of the third nanotrack 104c from the first end 122c to the second end 122d is at least about 210 nanometers. A width W2 of the third nanotrack 104c is about 80 nm. In one example, a thickness of the nanotrack is about 1 nanometer.

Nucleating devices 106a, and 106b are disposed about the first end of the nanotracks 104a, and 104b respectively. For example, nucleating device 106a is disposed about the first end 122a of the first nanotrack 104a. Nucleating device 106b is disposed about the first end 122b of the second nanotrack 104b. In one example, the nucleating devices are magnetic tunnel junction devices. By selectively passing current through the nucleating devices, a skyrmion is nucleated about the first end of the nanotrack. In one example, presence of the skyrmion is indicative of a first value, for example, a value of 1 and absence of the skyrmion is indicative of a second value, for example, a value of 0. In this example, the nucleating device 106a sets the input value for input A, and nucleating device 106b sets the input value for input B.

Skyrmions are topologically protected magnetic configurations observed in magnets lacking inversion symmetry. Their topological protection comes from nonzero winding number. This result in their robustness against thermal fluctuations and disorder. Magnetic skyrmions are technologically intriguing due to their small size (typically less than 10 nm), ultra low currents required for their manipulation, for example, selective movement inside the nanotracks. They have large annihilation energy barrier (annihilation energy Ea>50$k_B$T where $k_B$ is Boltzmann constant and T is temperature. This large annihilation energy barrier can result in lifetimes greater than 10 years, generally suitable for device applications.

Skyrmions are stabilized by the presence of Dzyaloshinskii-Moriya interactions (DMIs) observed in chiral magnets or at the ferromagnet/heavy metal layer (FM-HM layer) interface. The interfacial spin orbit interaction give rise to DMI interaction at the FM-HM layer interface and is responsible for the stabilization of skyrmion bits in the ferromagnet. The same interfacial spin orbit interaction is responsible for spin Hall effect in the heavy metal layer. Further, in the proposed design the skyrmions are confined to the ferromagnet nanotracks due to edge repulsion. The skyrmion bits are nucleated by passing current through the magnetic tunnel junction positioned at each of the input nodes. The skyrmions are propagated through the spin orbit torque resulting from the x-polarized electrons accumulated at the ferromagnet/heavy metal layer interface when the charge current flows in the y-direction in the heavy metal layer.

In general, magnetic skyrmion is a stable nano sized spin configurations with topological property that is locally nucleated by injection of spin-polarized current and displaced in the ferromagnet nanotrack by current-induced spin torques.

The sense device 108 is selectively disposed about the central portion 110 of the substrate 102. The sense device 108 is configured to sense the presence of the skyrmion about the central portion 110 of the substrate 102. In one example, presence of the skyrmion is indicative of a first value, for example, a value of 1 and absence of the skyrmion is indicative of a second value, for example, a value of 0. In some examples, the sense device 108 is a magnetic tunnel junction device.

When a charge current Ic is passed through the substrate 102, nucleated skyrmions are configured to travel towards the central portion 110 of the substrate 102. In one example, the charge current Ic flows along the Y axis, from the first end 116a, and the second end 116b towards the ground pad 118 about the central portion 110 of the substrate 102. The skyrmions move along the Y axis, due to the spin orbit torque resulting from polarized electrons accumulated about the ferromagnet-heavy metal layer interface when the charge current flows in the heavy metal layer. Further, the skyrmions are confined to the nanotracks due to edge repulsion. In one example, a skyrmion moving in a first direction due to a charge current in the first direction has a tendency to be biased to shift laterally. As an example, the skyrmion moving along the +Y direction, when the charge current is flowing in the +Y direction has a tendency to be biased to shift along the −X direction. Similar shifting of the skyrmions will occur based on the direction of flow of the charge current. Further details about the selective movement of the nucleated skyrmions along the nanotracks will now be described with reference to FIGS. 2B to 2H.

Figure 2A:
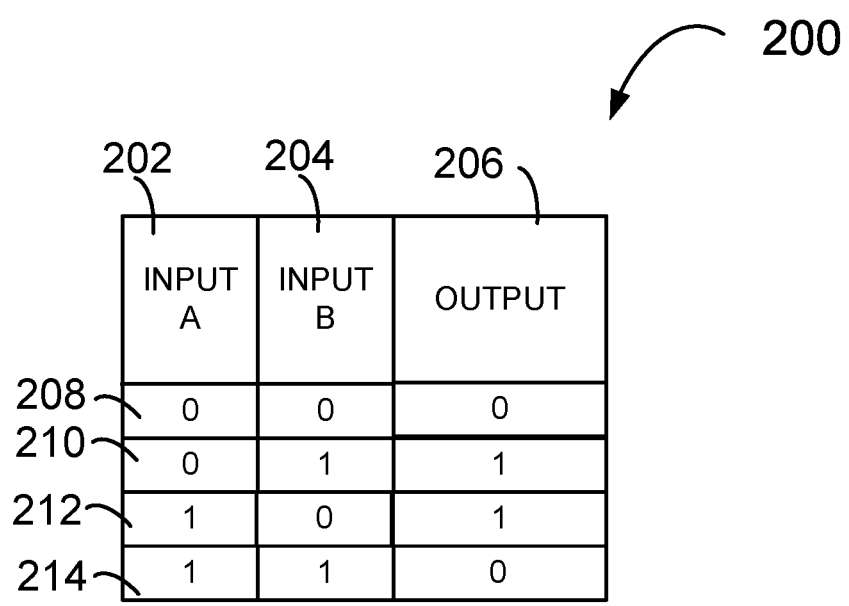
FIG. 2A shows an example truth table for a two input logic device, according to one aspect of the present disclosure.

FIG. 2A shows an example truth table 200 for a two input logic device, according to an example of this disclosure. Referring now to table 200, Input A is shown in column 202, input B is shown in column 204, and output is shown in column 206. For example, referring to row 214, when both inputs A, and B are 1, the output is 1. Similarly, referring to rows 210, and 212, if only one of the inputs is 1, the output is a 1. Similarly, referring to row 208, when both the inputs are a zero, output is a 0. As one skilled in the art appreciates, this logic represents a two input XOR logic. As previously described, presence of a skyrmion at the input is indicative of a value of 1 and absence of a skyrmion at the input is indicative of a value of 0. Further, presence of a skyrmion at the output is indicative of a value of 1 and absence of a skyrmion at the output is indicative of a value of 0. Now, referring to FIGS. {2B to 2H}, selective movement of the skyrmion from the first end of the first nanotrack 104a and the second nanotrack 104b towards the output 110 is now described, for various combinations of input values.

Figure 2B:
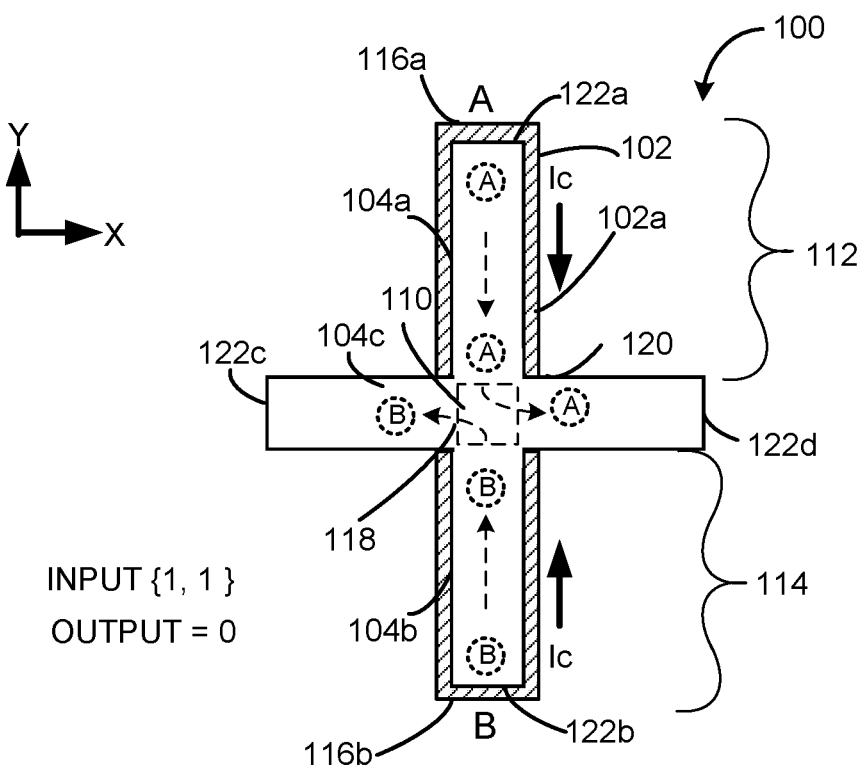
FIGS. 2B to 2D show selective movement of the skyrmion from the first end of the nanotrack towards the central portion, for various combinations of input values shown in the truth table of FIG. 2A, according to one aspect of the present disclosure.

Now, referring to FIG. 2B, logic device 100 is shown with input values A, and B set as 1, 1 respectively, at the first end of the first nanotrack 104a and the first end of the second nanotrack 104b. As previously described, a skyrmion is selectively nucleated at inputs A, and B. Nucleated skyrmion at input A, and B are shown as skyrmion A, and skyrmion B. When charge current Ic is passed in the Y direction, from the first end 116a, and second end 116b towards the ground pad 118, both the skyrmions A, and B will move towards the central portion 110. The skyrmions have a tendency to be biased to move in the +X direction when the charge current is flowing in −Y direction, skyrmion A will be moving towards the second end 122d of the third nanotrack 104c, as it approaches the central portion 110. Similarly, skyrmion B will be moving away from the central portion 110, towards the first end 122c of the third nanotrack 104c. Eventually when both the skyrmions A, and B approach the central portion 110, they repel each other. This results in skyrmion A moving into the third nanotrack 104c, towards the second end 122d, while skyrmions B moving into the third nanotrack towards the first end 122c. And no skyrmion is disposed about the central portion 110.

As previously described, the output is measured by the sensor disposed about the central portion 110. In this example, we notice that no skyrmion is disposed in the central portion 110. As no skyrmion is present at the central portion 110, the sensor will detect the absence of the skyrmion and yield a value of 0. This result is consistent with the result expected according to row 214 of the truth table 200 of FIG. 2A.

Figure 2C:
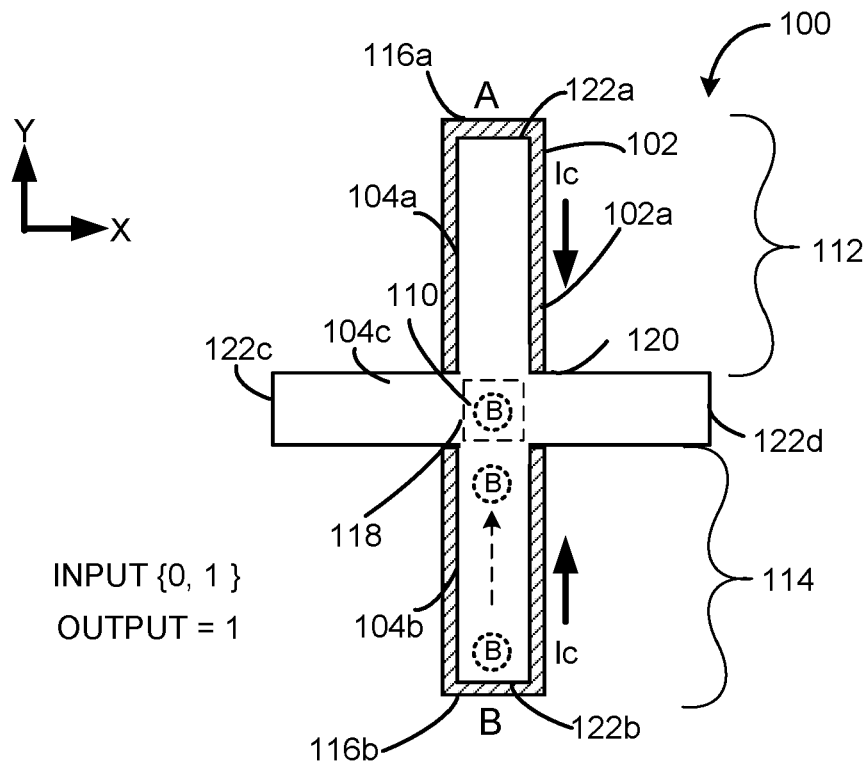

Now, referring to FIG. 2C, logic device 100 is shown with input values A, and B set as 0, 1 respectively, at the first end of the first nanotrack 104a and the second nanotrack 104b. As previously described, a skyrmion is selectively nucleated at input B. Nucleated skyrmion at input B is shown as skyrmion B. When charge current Ic is passed in the Y direction, from the first end 116a, and the second end 116b towards the ground pad 118, skyrmion B will move towards the central portion 110. The skyrmions have a tendency to be biased to move in the −Y direction when the charge current is flowing in +Y direction. Regardless, when skyrmion B reaches the central portion 110, no other skyrmion is present to interact and move the skyrmion B. Therefore, skyrmion B will rest about the central portion 110. This results in skyrmion B disposed about the central portion 110.

As previously described, the output is measured by the sensor disposed about the central portion 110. In this example, we notice that the skyrmion B is now disposed about the central portion 110. As there is a skyrmion present in the central portion 110, the sensor will detect the presence of the skyrmion and yield a value of 1. This result is consistent with the result expected according to row 210 of the truth table 200 of FIG. 2A.

Figure 2D:
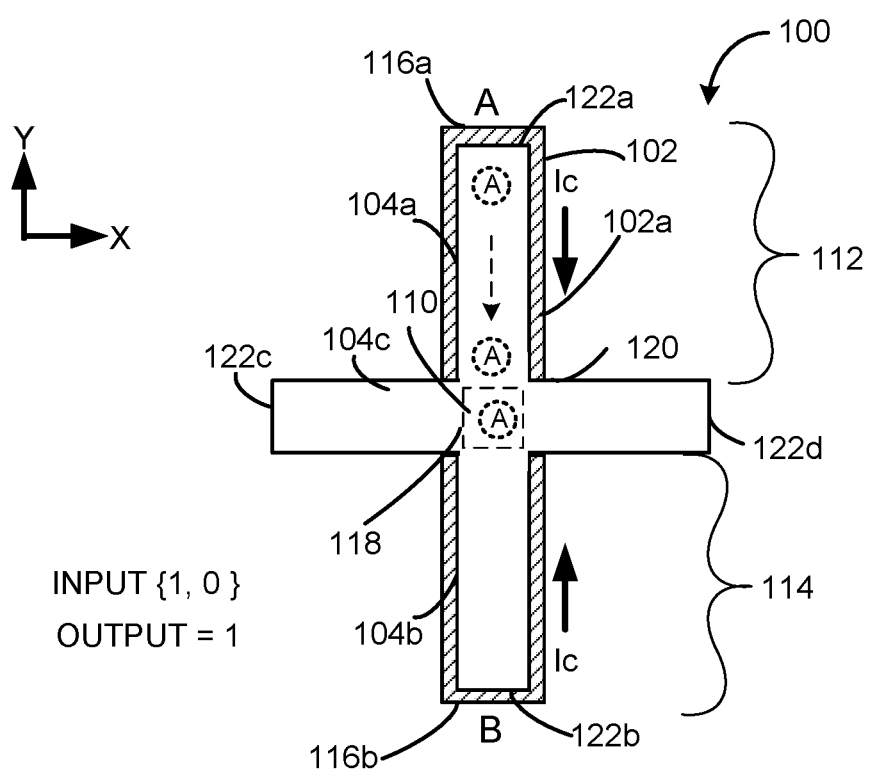

Now, referring to FIG. 2D, logic device 100 is shown with input values A, and B, set as 1, 0 respectively, at the first end of the first nanotrack 104a and the second nanotrack 104b. As previously described, a skyrmion is selectively nucleated at input A. Nucleated skyrmion at input A is shown as skyrmion A. When charge current Ic is passed in the Y direction, from the first end 116a, and second end 116b towards the ground pad 118, skyrmion A will move towards the central portion 110. The skyrmions have a tendency to be biased to move in the −X direction when the charge current is flowing in +Y direction, skyrmion A will be moving away from the central portion 110, as it approaches the central portion 110. Regardless, when skyrmion A reaches the central portion 110, no other skyrmion is present to interact and move the skyrmion A. Therefore, skyrmion A will rest about the central portion 110. This results in skyrmions C disposed about the central portion 110.

As previously described, the output is measured by the sensor disposed about the central portion 110. In this example, we notice that the skyrmion A is now disposed about the central portion 110. As there is a skyrmion present in the central portion 110, the sensor will detect the presence of the skyrmion and yield an output value of 1. This result is consistent with the result expected according to row 212 of the truth table 200 of FIG. 2A.

When the input values A, and B are set as 0, 0 respectively, at the first end of the first nanotrack 104a and the second nanotrack 104b, no skyrmions are present at the first end of the nanotracks. When the charge current Ic is passed, there will be no skyrmions that moves towards the central portion 110. As no skyrmion is detected at the central portion 110, the sensor will detect the absence of the skyrmion and yield a value of 0. This result is consistent with the result expected according to row 208 of the truth table 200 of FIG. 2A.

Figure 3A:
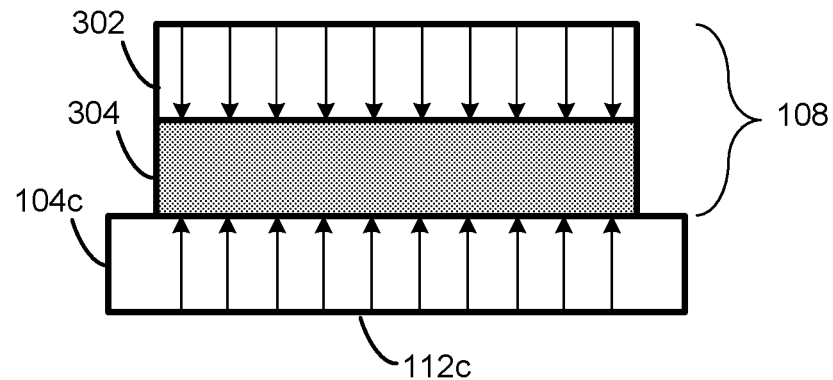
FIGS. 3A and 3B show example function and feature of a sensor, according to one aspect of the present disclosure.
Figure 3B:
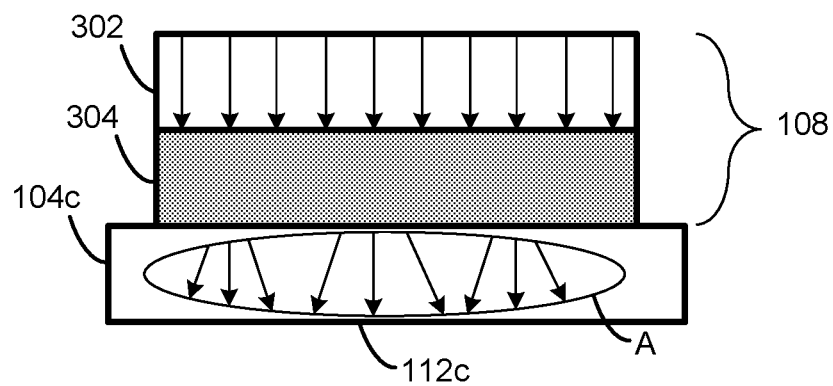

Now, referring to FIGS. 3A and 3B, example structure and operation of the sensor 108 is described. Referring to FIG. 3A, the sensor 108 includes an output ferromagnetic layer 302 and a spacer layer 304. The sensor 108 is disposed over the central portion 110. The magnetic orientation of the output ferromagnetic layer 302 is pinned such that the direction of the magnetic orientation of the output ferromagnetic layer 302 (as shown by arrows in the output ferromagnetic layer 302) is antiparallel to that of the ferromagnetic output portion 120 (as shown by arrows in the ferromagnetic output portion 120). This combination structure of the output ferromagnetic layer 302, spacer layer 304 and the central portion 110 acts as a magnetic tunnel junction stack. In some examples, the output ferromagnetic layer 302 may be a CoFe alloy or a CoFeB alloy. The spacer layer 304 may be a MgO (Magnesium Oxide) layer.

In one example, different tunneling magneto resistive values are measured based upon the presence or absence of the skyrmion at the central portion 110. In one example, when no skyrmion is present at the central portion 110, the tunneling magneto resistive value will be higher as compared to a presence of a skyrmion at the central portion 110. This higher tunneling magneto resistive value is indicative of absence of the skyrmion at the central portion 110.

Now referring to FIG. 3B, when a skyrmion, for example, skyrmion A is present about the central portion 110, direction of some of the magnetic orientation inside the skyrmion will be parallel or quasi-parallel to the pinned direction of magnetic orientation inside the output ferromagnetic layer 302 (as shown by arrows inside the skyrmion A). Due to the quasi-parallel magnetic orientation, the resistance across the magnetic tunnel junction will be low. In one example, this indicates the presence of the skyrmion about the central portion 110.

Figure 4:
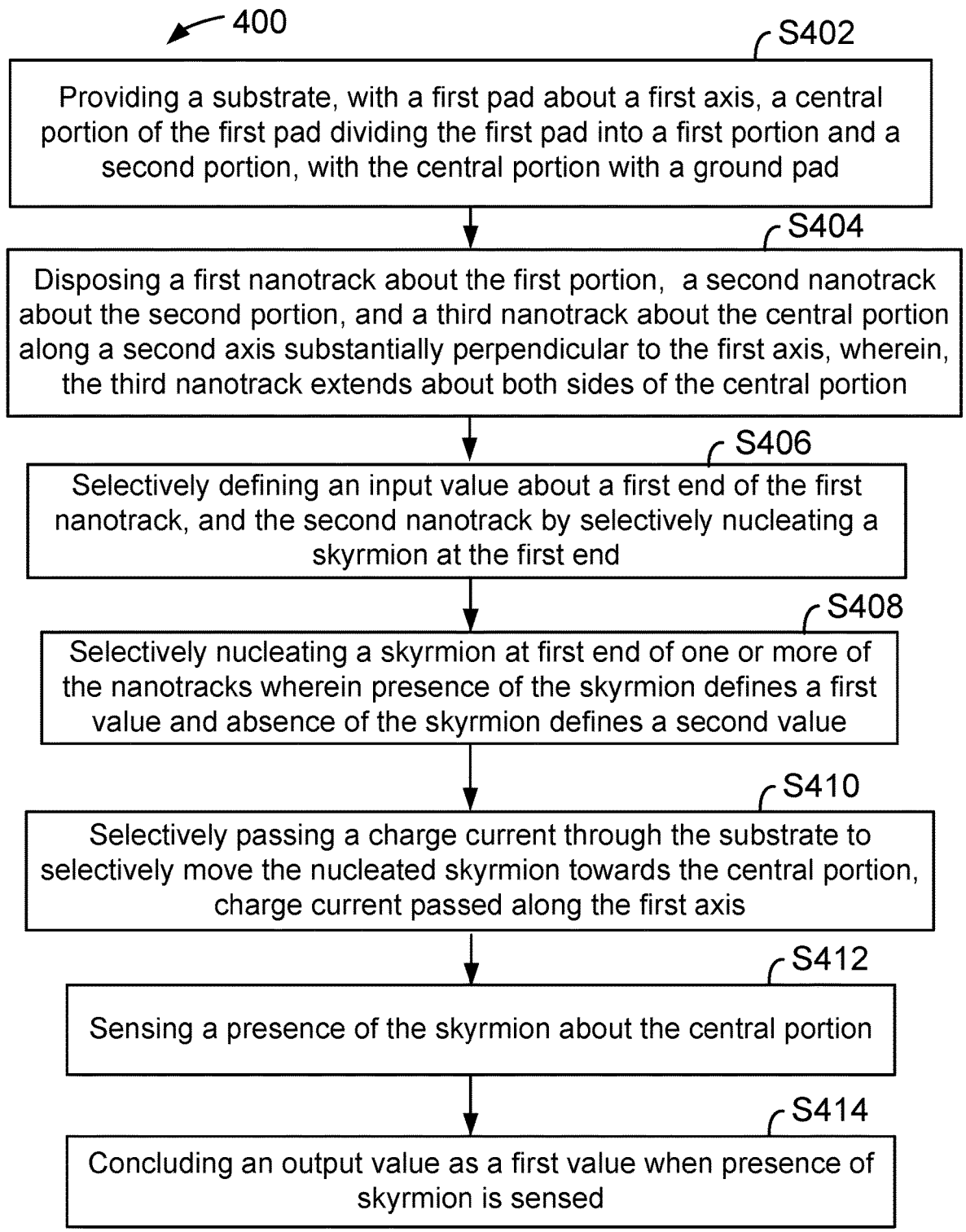
FIG. 4 shows an example flow diagram, according to one aspect of the present disclosure.

Now, referring to FIG. 4, an example flow diagram 400 is described. In block S402, a substrate with a first pad about a first axis is provided. A central portion of the first pad divides the first pad into a first portion and a second portion. The central portion has a ground pad. For example, substrate 102 is provided, with a first pad 102. The first pad 102 is divided into a first portion 112, a second portion 114, and a central portion 110. A ground pad 118 is disposed about the central portion 110.

In block S404, a first nanotrack is disposed about the first portion, a second nanotrack is disposed about the second portion, and a third nanotrack is disposed about the central portion, along a second axis substantially perpendicular to the first axis, wherein the third nanotrack extends about both sides of the central portion. For example, first nanotracks 104a, a second nanotrack 104b, and a third nanotrack 104c are provided. The first nanotrack 104a is disposed about the first portion 112. The second nanotrack 104b is disposed about the second portion 114. The third nanotrack 104c extends about both sides of the central portion 110.

In block S406, an input value is defined about a first end of the first nanotrack, and the second nanotrack by selectively nucleating a skyrmion at the first end. Various combinations of selectively nucleating one or more skyrmions was previously described with reference to FIGS. 2B-2D. For example, referring to FIG. 2B, logic device 100 was shown with input values A, and B set as 1, 1 respectively, at the first end of the nanotracks. As previously described, a skyrmion is selectively nucleated at inputs A, and B. Nucleated skyrmion at input A, and B are shown as skyrmion A, and skyrmion B.

In block S410, a charge current is selectively passed through the substrate to selectively move the nucleated skyrmion towards the central portion, charge current passed along the first axis. As previously described with reference to FIGS. 2B-2D, when charge current Ic is passed from the first end, the second end of the substrate towards the ground pad, the skyrmions will move towards the central portion.

In block S412, a presence of the skyrmion is sensed about the output portion of the second nanotrack. For example, presence of the skyrmion is sensed about the central portion 110.

In block S414, concluding an output value as a first value, when the presence of the skyrmion is sensed. For example, presence of the skyrmion about the central portion 110 is indicative of an output of first value.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that phraseology or terminology employed herein is for the purpose of description and not of limitation.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method, including:
   providing a substrate, substrate including a first pad disposed about a first axis, a central portion of the first pad dividing the first pad into a first portion, and a second portion, the first portion of the first pad extending from a first end of the substrate to the central portion of the first pad, and the second portion of the first pad extending from a second end of the substrate to the central portion of the first pad;
   disposing a ground pad about the central portion of the first pad;
   disposing a first nanotrack about the first portion of the first pad, a second nanotrack about the second portion of the first pad, a third nanotrack about the central portion of the first pad, and wherein, the third nanotrack extends about both sides of the central portion along a second axis, the second axis substantially perpendicular to the first axis, and wherein a first end of the first nanotrack is disposed about the first end of the substrate, a first end of the second nanotrack is disposed about the second end of the substrate;
   selectively defining an input value by selectively nucleating a skyrmion about the first end of the first nanotrack, wherein presence of the skyrmion indicative of a first value and absence of the skyrmion indicative of a second value;
   selectively defining another input value by selectively nucleating a skyrmion about the first end of the second nanotrack, wherein presence of the skyrmion indicative of a first value and absence of the skyrmion indicative of a second value;
   selectively passing a charge current through the substrate to selectively move the nucleated skyrmions towards the central portion of the first pad, charge current passed along the first axis;
   sensing the presence of the skyrmion about the central portion; and
   concluding an output value as the first value when the presence of the skyrmion is sensed.

2. The method of claim 1, wherein, at least one skyrmion in one of the first nanotrack and the second nanotrack moves to the central portion of the first pad.

3. The method of claim 1, wherein, the nucleated skyrmion in the first nanotrack, and the second nanotrack, move towards the central portion of the first pad.

4. The method of claim 1, further including,
   selectively disposing at least one nucleating device adjacent the first end of the first nanotrack, the first end of the second nanotrack; and
   selectively energizing the nucleating device to selectively nucleate skyrmion in one or more of the first end of the first nanotrack and the first end of the second nanotrack, to indicate the input value.

5. The method of claim 1, further including,
selectively disposing at least one sensing device adjacent the central portion to selectively sense the presence of the skyrmion.

6. The method of claim 1, wherein, one of the skyrmions moves into the central portion, when no other skyrmion is present about the central portion of the first pad.

7. The method of claim 1, wherein,
a length of the first nanotrack, and the second nanotrack is about 240 nm; and
a width of the first nanotrack, and the second nanotrack is about 80 nm.

8. The method of claim 1, wherein when two skyrmions are nucleated, the nucleated skyrmions will be repelled about the central portion of the first pad, and moved to the third nanotrack away from the central portion.

9. The method of claim 1, wherein the movement of the skyrmion in the first nanotrack is biased to move towards the central portion, and the movement of the skyrmion in the second nanotrack is biased to move towards the central portion of the first pad, when the charge current flows from the first end, and the second end of the substrate towards the ground pad.

10. A system, including:
a substrate, the substrate including a first pad disposed about a first axis, a central portion of the first pad dividing the first pad into a first portion, and a second portion, the first portion of the first pad extending from a first end of the substrate to the central portion of the first pad, and the second portion of the first pad extending from a second end of the substrate to the central portion of the first pad;
a ground pad disposed about the central portion of the first pad;
a first nanotrack disposed about the first portion of the first pad, a second nanotrack disposed about the second portion of the first pad, a third nanotrack disposed about the central portion of the first pad, and wherein, the third nanotrack extends about both sides of the central portion along a second axis, the second axis substantially perpendicular to the first axis, and wherein a first end of the first nanotrack is disposed about the first end of the substrate, a first end of the second nanotrack is disposed about the second end of the substrate;
an input value is selectively defined by selectively nucleating a skyrmion about the first end of the first nanotrack, wherein presence of the skyrmion indicative of a first value and absence of the skyrmion indicative of a second value;
another input value is selectively defined by selectively nucleating a skyrmion about the first end of the second nanotrack, wherein presence of the skyrmion indicative of a first value and absence of the skyrmion indicative of a second value;
a charge current is selectively passed through the substrate to selectively move the nucleated skyrmions towards the central portion of the first pad, charge current passed along the first axis;
a presence of the skyrmion is sensed about the central portion; and
an output value is concluded as the first value when the presence of the skyrmion is sensed.

11. The system of claim 10, wherein, at least one skyrmion in one of the first nanotrack and the second nanotrack moves to the central portion of the first pad.

12. The system of claim 10, wherein, the nucleated skyrmion in the first nanotrack, and the second nanotrack, move towards the central portion of the first pad.

13. The system of claim 10, further including,
at least one nucleating device is selectively disposed adjacent the first end of the first nanotrack, the first end of the second nanotrack; and
the nucleating device is selectively energized to selectively nucleate skyrmion in one or more of the first end of the first nanotrack and the first end of the second nanotrack, to indicate the input value.

14. The system of claim 10, further including,
at least one sensing device is selectively disposed adjacent the central portion to selectively sense the presence of the skyrmion.

15. The system of claim 10, wherein, one of the skyrmions moves into the central portion, when no other skyrmion is present about the central portion of the first pad.

16. The system of claim 10, wherein,
a length of the first nanotrack, and the second nanotrack is about 240 nm; and
a width of the first nanotrack, and the second nanotrack is about 80 nm.

17. The system of claim 10, wherein when two skyrmions are nucleated, the nucleated skyrmions will be repelled about the central portion of the first pad, and moved to the third nanotrack away from the central portion.

18. The system of claim 10, wherein the movement of the skyrmion in the first nanotrack is biased to move towards the central portion, and the movement of the skyrmion in the second nanotrack is biased to move towards the central portion of the first pad, when the charge current flows from the first end, and the second end of the substrate towards the ground pad.

* * * * *